(12) United States Patent
Suzuki et al.

(10) Patent No.: US 8,552,483 B2
(45) Date of Patent: Oct. 8, 2013

(54) X-Y ADDRESS TYPE SOLID STATE IMAGE PICKUP DEVICE AND METHOD OF PRODUCING THE SAME

(75) Inventors: Ryoji Suzuki, Kanagawa (JP); Keiji Mabuchi, Kanagawa (JP); Tomonori Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 13/541,428

(22) Filed: Jul. 3, 2012

(65) Prior Publication Data

US 2012/0267691 A1 Oct. 25, 2012

Related U.S. Application Data

(63) Continuation of application No. 11/981,389, filed on Oct. 30, 2007, which is a continuation of application No. 10/192,409, filed on Jul. 10, 2002, now Pat. No. 7,294,873.

(30) Foreign Application Priority Data

Jul. 11, 2001 (JP) ................................. 2001-210270

(51) Int. Cl.
*H01L 31/102* (2006.01)
*H01L 31/101* (2006.01)
*H01L 31/062* (2012.01)
*H01L 31/113* (2006.01)
*H01L 27/146* (2006.01)

(52) U.S. Cl.
USPC ........... 257/294; 257/184; 257/187; 257/292; 257/444; 257/E31.058

(58) Field of Classification Search
USPC ........... 257/294, 184, 187, 292, 444, E31.058
See application file for complete search history.

(56) References Cited

U.S. PATENT DOCUMENTS 3,748,546 A 7/1973 Allison
4,454,526 A * 6/1984 Nishizawa et al. ........... 257/292
5,698,874 A 12/1997 Hayashi
(Continued)

FOREIGN PATENT DOCUMENTS

EP 1028470 * 8/2000
JP 60-254769 A 12/1985
(Continued)

OTHER PUBLICATIONS

Japanese Office Action issued Nov. 8, 2011 in related Japanese Application No. 2008-028315.

(Continued)

*Primary Examiner* — Bradley K Smith
*Assistant Examiner* — Alexander Belousov
(74) *Attorney, Agent, or Firm* — Rader, Fishman & Grauer PLLC

(57) ABSTRACT

In an X-Y address type solid state image pickup device represented by a CMOS image sensor, a back side light reception type pixel structure is adopted in which a wiring layer is provided on one side of a silicon layer including photo-diodes formed therein. and visible light is taken in from the other side of the silicon layer, namely, from the side (back side) opposite to the wiring layer. wiring can be made without taking a light-receiving surface into account, and the degree of freedom in wiring for the pixels is enhanced.

17 Claims, 10 Drawing Sheets

(56) References Cited

U.S. PATENT DOCUMENTS

| | | |
|---|---|---|
| 5,986,297 A | 11/1999 | Guidash et al. |
| 5,998,292 A * | 12/1999 | Black et al. .................. 438/618 |
| 6,040,593 A | 3/2000 | Park |
| 6,051,857 A * | 4/2000 | Miida ........................... 257/292 |
| 6,150,676 A * | 11/2000 | Sasaki ........................... 257/191 |
| 6,168,965 B1 | 1/2001 | Malinovich et al. |
| 6,169,319 B1 | 1/2001 | Malinovich et al. |
| 6,212,107 B1 * | 4/2001 | Tsukada .................. 365/189.09 |
| 6,229,165 B1 | 5/2001 | Sakai et al. |
| 6,239,499 B1 | 5/2001 | Zhao et al. |
| 6,448,104 B1 | 9/2002 | Watanabe |
| 6,507,059 B2 | 1/2003 | Chen et al. |
| 6,858,827 B2 | 2/2005 | Sugiyama et al. |
| 2003/0025160 A1 | 2/2003 | Suzuki et al. |

FOREIGN PATENT DOCUMENTS

| | | |
|---|---|---|
| JP | 02-166767 A | 6/1990 |
| JP | 08-241977 A | 9/1996 |
| JP | 09-045886 A | 2/1997 |
| JP | 09-331051 A | 12/1997 |
| JP | 11-097655 A | 4/1999 |
| JP | 11-111960 A | 4/1999 |
| JP | 2000-031441 A | 1/2000 |
| JP | 2000-124438 A | 4/2000 |
| JP | 2000-150846 A | 5/2000 |
| JP | 2001-060543 A | 3/2001 |
| JP | 2003-031785 A | 1/2003 |

OTHER PUBLICATIONS

Japanese Office Action issued Nov. 8, 2011 for corresponding Japanese Application No. 2008-028314.

Japanese Office Action issue Jan. 24, 2012 for corresponding Japanese Application No. 2008-028314.

Japanese Office Action issued Oct. 2, 2012 for related Japanese Application No. 2012-091789.

Japanese Office Action issued Oct. 2, 2012 for related Japanese Application No. 2012-000659.

* cited by examiner

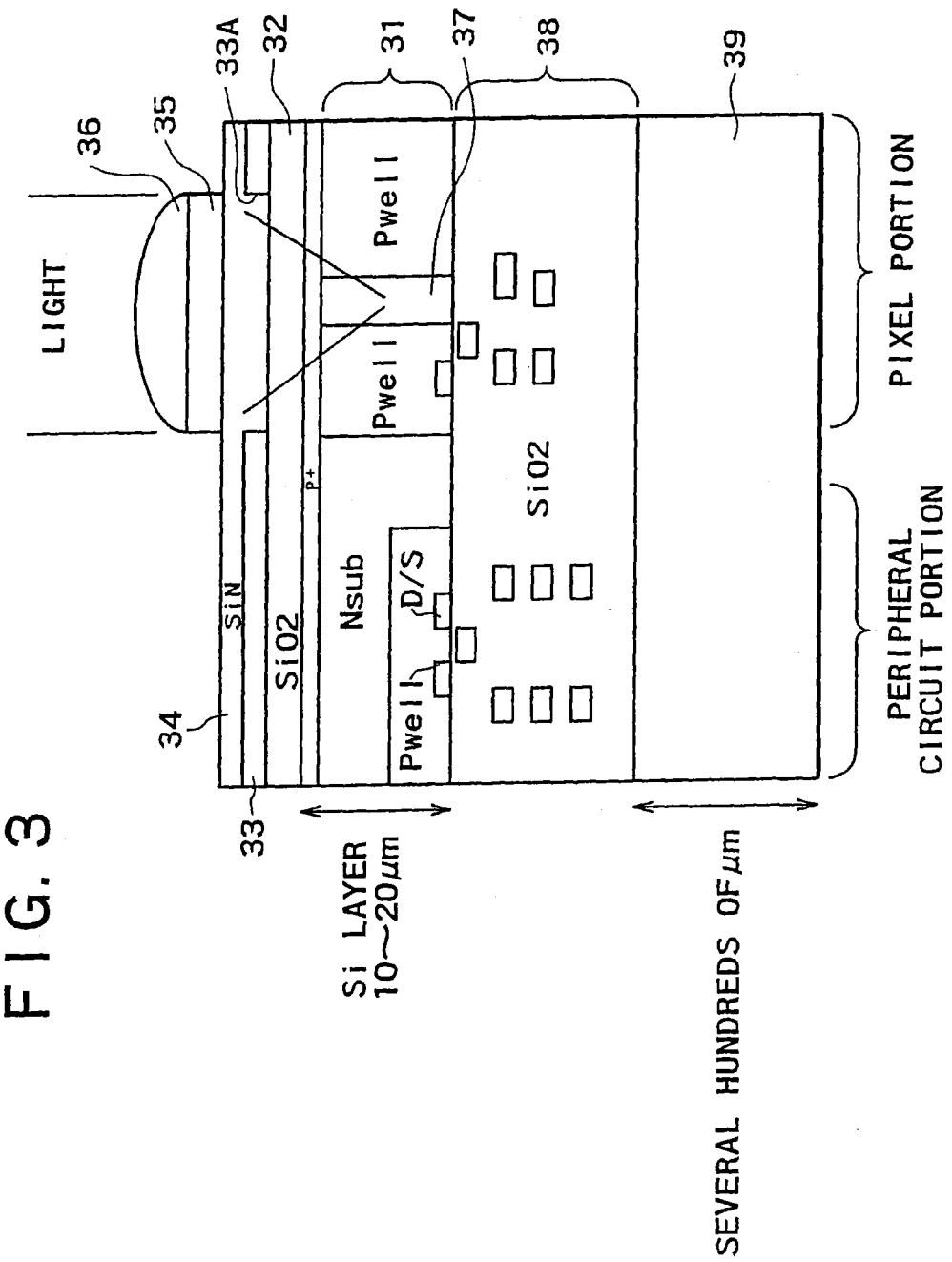
F I G. 3

BACKGROUND OF THE INVENTION

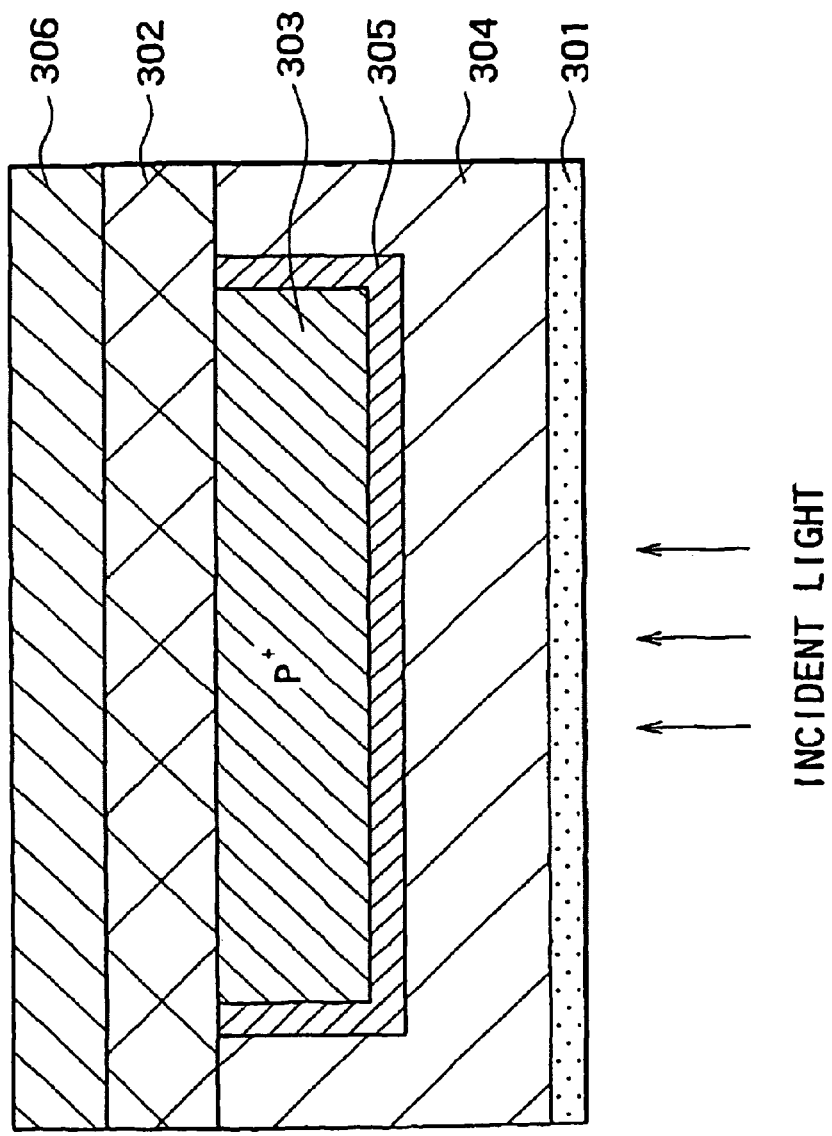

X-Y ADDRESS TYPE SOLID STATE IMAGE PICKUP DEVICE AND METHOD OF PRODUCING THE SAME

CROSS REFERENCES TO RELATED APPLICATIONS

This is a Continuation Application of U.S. patent application Ser. No. 11/981,389, filed Oct. 30, 2007, which is a Continuation Application of U.S. patent application Ser. No. 10/192,409, filed Jul. 10, 2002, now U.S. Pat. No. 7,294,873, which in turn claims priority from Japanese Patent Application No.: 2001-210270, filed Jul. 11, 2001. The entire contents of which are incorporated herein by reference.

BACKGROUND OF THE INVENTION

The present invention relates to an X-Y address type solid state image pickup device in which unit pixels each including an active device for converting a signal charge obtained through photo-electric conversion by a photo-electric conversion device into an electrical signal and outputting the electrical signal are arranged in a matrix form, and a method of producing the same.

Solid state image pickup devices are generally classified into a charge transfer type solid state image pickup device represented by a CCD image sensor and an X-Y address type solid state image pickup device represented by a CMOS image sensor. Of the two types, the X-Y address type solid state image pickup device will be described referring to FIG. 9 which shows an example of the sectional structure of the CMOS image sensor taken as an example.

As is clear from FIG. 9, the CMOS image sensor has a construction in which a pixel portion 100 for photo-electric conversion of incident light and a peripheral circuit portion 200 for reading a signal by driving pixels, processing the signal and outputting the processed signal are integrated on the same chip (substrate). Transistors constituting the pixel portion 100 and transistors constituting the peripheral circuit portion 200 have a part of wiring in common.

The pixel portion 100 includes a photo-diode 102 provided on the surface of an N type silicon substrate 101 having a thickness of about several hundreds of μm, and a color filter 105 and a micro-lens 106 arranged on the upper side of the photo-diode 102 with a wiring layer 103 and a passivation layer 104 therebetween. The color filter 105 is provided for obtaining color signals.

In the pixel portion 100, transistors and wirings are present between the photo-diode 102 and the color filter 105. Therefore, in order to enhance the ratio of the incident light on the photo-diode 102 to the incident light on the pixel portion 100, namely, numerical aperture, the incident light is focused on the photo-diode 102 through the gaps between the wirings by the micro-lens 106.

However, in the related art of the pixel structure in which the incident light is taken into the photo-diode 102 through the wiring layer 103 as mentioned above, a portion of the light focused by the micro-lens 106 is scattered by the wirings, resulting in various problems as follows.

(1) The amount of light is reduced by the portion scattered by the wirings, so that sensitivity is lowered.

(2) The portion of light scattered by the wirings enter into photo-diodes in the adjacent pixels, resulting in color mixture.

(3) Characteristics are lowered due to limitations on the basis of wiring, such as the limitations that a wiring cannot be disposed on the upper side of the photo-diode 102 and a thick wiring cannot be laid, and it is difficult to miniaturize the pixels.

(4) The light is incident skewly on pixels and the ratio of the light portion scattered to the entire amount of the incident light is increased in a peripheral area, so that dark shading occurs heavily at the pixels in the peripheral area.

(5) It is difficult to produce a COMS image sensor by an advanced CMOS process with an increased number of wiring layers, because the distance from the micro-lens 106 to the photo-diode 102 is increased.

(6) A library of advanced CMOS processes cannot be used due to (5) above, a change in layout of the circuit in the library is needed, and an increase in area is caused by limitations on the wiring layer, so that production cost is raised and pixel area per pixel is enlarged.

Further, when light with a long wavelength such as red color light undergoes photo-electric conversion in a P well 107 located deeper than the photo-diode 102 in FIG. 9, the electrons generated diffuse through the P well 107, to enter into photo-diodes at other positions, resulting in color mixture. In addition, if the electrons enter into a pixel shielded from light for detection of black, a black level may be detected erroneously.

Besides, in the CMOS image sensors in recent years, there is the tendency that the functions which have been provided on different chips, such as a camera signal processing circuit and a DSP (Digital Signal Processor), are mounted on the same chip as the pixel portion. Because the process generation is advanced in the manner of 0.4 μm→0.25 μm→0.18 μm→0.13 μm, if the CMOS image sensors themselves cannot cope with these new processes, they cannot share in the benefit of miniaturization, and cannot utilize the rich CMOS circuit library and IP.

However, the degree of multilayer property of the wiring structure advances as the process generation advances; for example, three-layer wiring is used in the 0.4 μm process, and, on the other hand, eight-layer wiring is used in the 0.13 μm process. Besides, the thickness of wiring is also increased, and the distance from the micro-lens 106 to the photo-diode 102 is increased by a factor of three to five. Therefore, with the face side irradiation type pixel structure in which light is led to the light-receiving surface of the photodiode 102 through the wiring layer according to the related art, it has come to be impossible to efficiently focus the light on the light-receiving surface of the photo-diode 102, and, as a result, the above-mentioned problems (1) to (6) have come to be conspicuous.

On the other hand, the charge transfer type solid state image pickup devices include the back side light reception type frame transfer CCD image sensor which receives light from the back side. In the back side light reception type frame transfer CCD image sensor, a silicon substrate is thinned to receive light on the rear side (back side), a signal charge obtained through photo-electric conversion inside silicon is caught by a depletion layer extending from the face side, is accumulated in a potential well on the face side and is outputted.

An example of the sectional structure of a photo-diode in the back side light reception type frame transfer CCD image sensor is shown in FIG. 10. In this example. the photo-diode is composed of a P type region 303 at the surface on the side of an oxide film 302 provided with wirings or the like with respect to the silicon substrate 301, and is covered by an N type well (epi layer) 304 through a depletion layer 305. A reflective film 306 of aluminum is provided on the oxide film 302.

In the case of the back side light reception type CCD image sensor having the above-mentioned structure, there is the problem that the sensitivity to blue light for which absorbance is high is lowered. In addition, the signal charge generated upon photo-electric conversion at a shallow position of the light incident on the rear side diffuses, to enter into photo-diodes in the surroundings at a certain ratio. In addition to these problems, the CCD image sensor is characterized in that the height of the wiring layer need not be enlarged because system-on-chip is not conducted, focusing by an on-chip lens is easy because a light-shielding film can be dropped into the surroundings of the photo-diode owing to an exclusive process, the above-mentioned problems (1) to (6) are not generated, and it is unnecessary to adopt the back side light reception structure. For these reasons, the back side light reception type CCD image sensor is rarely used at present.

On the other hand, in the case of the CMOS image sensor, the process used is one obtained by minor modifications of a standard CMOS process, so that adoption of the back side light reception structure offers the merits that the process is not affected by a wiring step and the newest process can always be used, which merits cannot be obtained with the CCD image sensor. However, as contrasted to the CCD image sensor, the wirings are present in many layers in the form of crossing lines, so that the above-mentioned problems (1) to (6) appear conspicuously as the problems peculiar to the CMOS image sensor (and hence the X-Y address type solid state image pickup device represented by this).

SUMMARY OF THE INVENTION

The present invention has been made in consideration of the above-mentioned problems. Accordingly, it is an object of the present invention to provide an X-Y address type solid state image pickup device represented by a CMOS image sensor in which miniaturization of pixels and a higher numerical aperture are made possible by adopting a back side light reception structure, and a method of producing the same.

In order to attain the above object, according to the present invention, there is provided an X-Y address type solid state image pickup device including a plurality of unit pixels each including an active device for converting a signal charge obtained through photo-electric conversion by a photo-electric conversion device into an electrical signal and outputting the electrical signal, the unit pixels being arranged in a matrix form, wherein a back side light reception type pixel structure is adopted in which a wiring layer for wiring the active devices is provided on one side of a device layer provided with the photo-electric conversion devices, and incident light is taken into the photo-electric conversion devices from the other side of the device layer, namely, from the side opposite to the wiring layer.

In the X-Y address type solid state image pickup device, the back side light reception type pixel structure is adopted, whereby it is unnecessitated to perform wiring by taking a light-receiving surface into account. Namely, wiring on the photo-electric conversion device region is made possible. By this, the degree of freedom in wiring the pixels is enhanced, and miniaturization of the pixels can be contrived.

BRIEF DESCRIPTION OF THE DRAWINGS

These and other objects of the invention will be seen by reference to the description, taken in connection with the accompanying drawing, in which:

FIG. 3 is a sectional view showing an example of the structures of a pixel portion and a peripheral circuit portion;

FIG. 10 is a sectional view showing the sectional structure of a photo-diode in a back side light reception type frame transfer CCD image sensor.

DETAILED DESCRIPTION OF THE PREFERRED EMBODIMENTS

Figure 1:
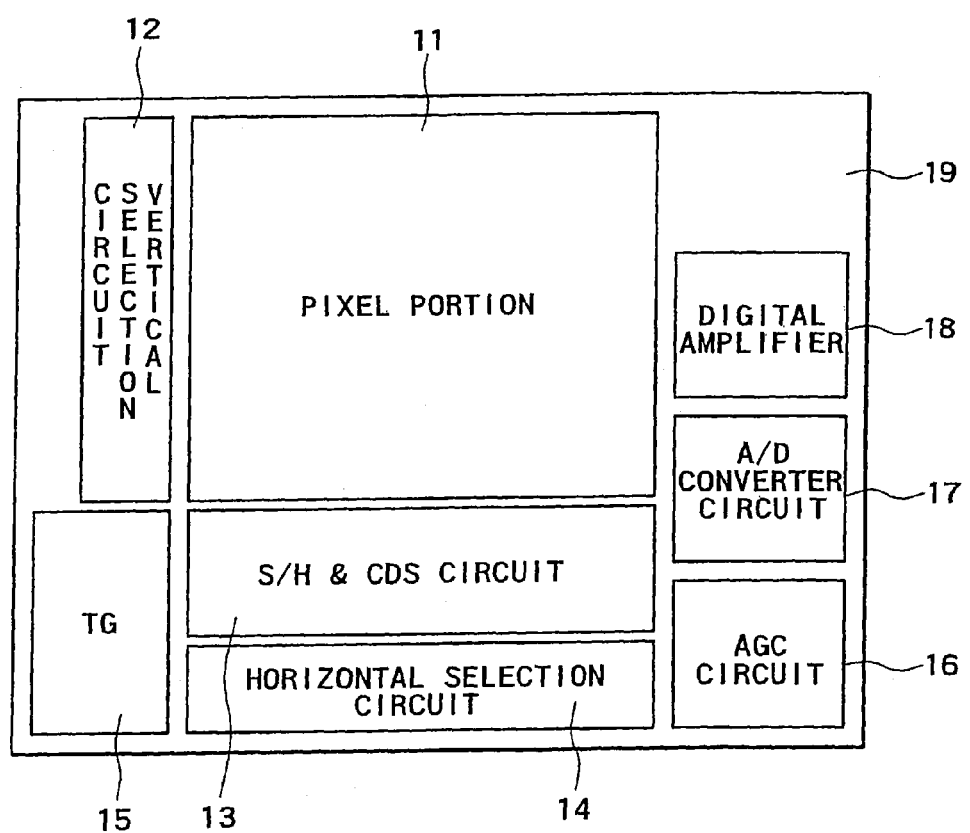
FIG. 1 is a general constitutional diagram showing an example of a CMOS image sensor according to one embodiment of the present invention.

Now, an embodiment of the present invention will be described in detail below referring to the drawings. In the present embodiment, a CMOS image sensor is taken as an example of the X-Y address type solid state image pickup device and will be described.

FIG. 1 is a general constitutional diagram showing an example of the CMOS image sensor according to one embodiment of the present invention. As is clear from FIG. 1, this CMOS image sensor forms a pixel portion 11, a vertical (V) selection circuit 12, an S/H (Sample/Hold) & CDS (Correlated Double Sampling) circuit 13, a horizontal (H) selection circuit 14, a timing generator (TG) 15, an AGC (Automatic Gain Control) circuit 16, an A/D converter circuit 17, a digital amplifier 18 and the like, which are mounted on the same substrate (chip) 19.

The pixel portion 11 composes a multiplicity of unit pixels (described later) arranged in a matrix form, and wirings include address conductors and the like disposed on a row basis and vertical signal conductors disposed on a column basis. The vertical selection circuit 12 sequentially selects pixels on a row basis, and pixel signals are read from individual pixels in the selected row into the S/H & CDS circuit 13. The S/H & CDS circuit 13 subtracts zero level from a signal level for each of the pixel signals read out, removes fixed pattern dispersion (noise) on a pixel basis, and holds the signals.

The horizontal selection circuit 14 sequentially take out the pixel signals held in the S/H & CDS circuit 13, and transfers the pixel signals to the AGC circuit 16. The AGC circuit 16 amplifies the signals with an appropriate gain, and transfers the amplified signals to the A/D converter circuit 17. The A/D converter circuit 17 converts the analog signals into digital signals, and transfers the digital signals to the digital amplifier 18. The digital amplifier 18 amplifies the digital signals appropriately, and outputs the amplified digital signals. The operations of the vertical selection circuit 12, the S/H & CDS circuit 13, the horizontal selection circuit 14, the AGC circuit 16, the A/D converter circuit 17 and the digital amplifier 18 are performed based on various timing signals generated by the timing generator 15.

Figure 2:
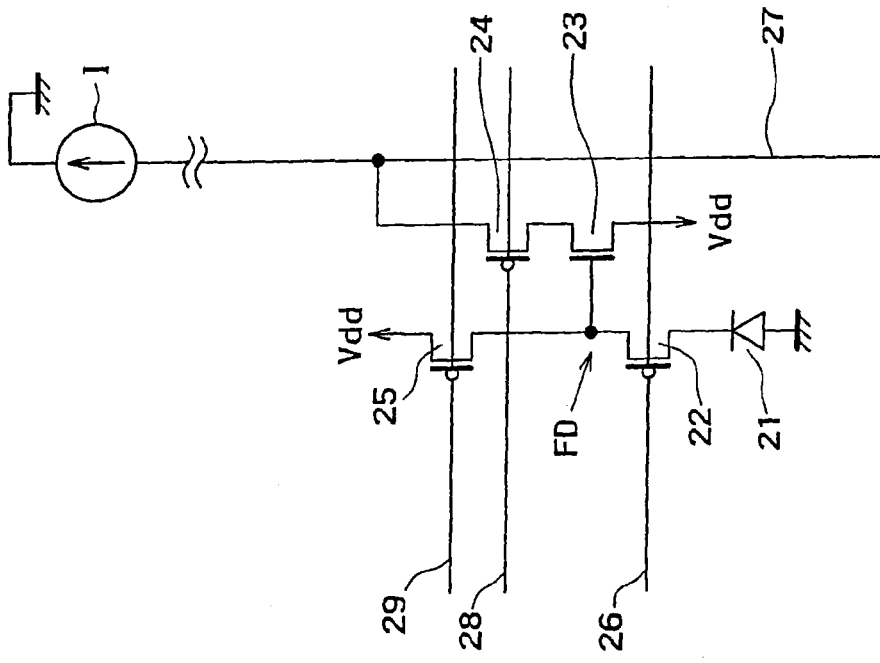
FIG. 2 is a circuit diagram showing an example of circuit constitution of unit pixel.

An example of circuit constitution of the unit pixel, which is a part peculiar to this CMOS image sensor, is shown in FIG. 2. As is clear from the figure, the unit pixel includes, for example, a photo-diode 21 as a photo-electric conversion device, and for the single photodiode 21, the unit pixel includes four transistors, namely, a transfer transistor 22, an amplifying transistor 23, an address transistor 24 and a reset transistor 25 as active devices.

The photo-diode 21 has its anode grounded, and performs photo-electric conversion for converting the incident light into an amount of charge (here, electrons) according to the amount of light. The transfer transistor 22 is connected between the cathode of the photo-diode 21 and a floating diffusion FD, and its gate is supplied with a transfer signal through a transfer wiring 26, thereby transferring the electrons generated upon photo-electric conversion by the photo-diode 21 to the floating diffusion FD.

To the floating diffusion FD is connected the gate of the amplifying transistor 23. The amplifying transistor 23 is connected to the vertical signal conductor 27 through the address transistor 24, and constitutes a source follower together with a fixed current source I which is provided outside the pixel portion. When an address signal is given to the gate of the address transistor 24 through the address wiring 28 and the address transistor 24 is turned ON, the amplifying transistor 23 amplifies the potential of the floating diffusion FD and output a voltage according to the potential to the vertical signal conductor 27. The vertical signal conductor 27 transmits the voltage outputted from each pixel to the S/H & CDS circuit 13.

The reset transistor 25 is connected between a power source Vdd and the floating diffusion FD, and its gate is supplied with a reset signal through a reset conductor 29, thereby resetting the potential of the floating diffusion FD to the potential of the power source Vdd. These operations are conducted simultaneously for the individual pixels in one row, because the wirings 26, 28, 29 connected respectively to the gates of the transfer transistor 22, the address transistor 24 and the reset transistor 25 are arranged on a row basis.

Here, as the wirings for the unit pixel, there are provided three wirings in the horizontal direction, namely, the transfer wiring 26, the address wiring 28 and the reset wiring 29, one wiring in the vertical direction, namely, the vertical signal conductor 27, and, further, a Vdd supply wiring, an internal wiring for connecting the floating diffusion FD with the gate of the amplifying transistor 23, and a two-dimensional wiring (not shown) used for a light-shielding film for a pixel boundary portion and a black level detecting pixel.

FIG. 3 is a sectional view showing an example of the structures of the pixel portion and the peripheral circuit portion. In FIG. 3, by polishing a wafer by CMP (Chemical Mechanical Polishing), a silicon (Si) layer (device layer) 31 having a thickness of about 10 to 20 µm is formed. The desirable range of the thickness is 5 to 15 µm for visible rays, 15 to 50 µm for infrared rays, and 3 to 7 µm for ultraviolet rays. The light-shielding film 33 is provided on one side of the silicon layer 31, with an SiO2 film 32 therebetween.

Different from the wirings, the light-shielding film 33 is laid out taking only optical elements into account. The light-shielding film 33 is provided with an opening portion 33A. A silicon nitride film (SiN) 34 is provided on the light-shielding film 33 as a passivation film, and a color filter 35 and a micro-lens 36 are provided on the upper side of the opening portion 33A. Namely, in this pixel structure, the light incident from one side of the silicon layer 31 is led to a light-receiving surface of the photo-diode 37 (described later) provided at the silicon layer 31 through the micro-lens 36 and the color filter 35. A wiring layer 38 including transistors and metallic wirings therein is provided on the other side of the silicon layer 31, and a substrate support member 39 is adhered to the lower side of the wiring layer 38.

Here, in the CMOS image sensor according to the related art. the face side light reception type pixel structure has been adopted in which the wiring layer is on the face side and incident light is taken in from the wiring layer side. On the other hand, in the CMOS image sensor according to the present embodiment, the back side light reception type pixel structure is adopted in which the incident light is taken in from the side (back side) opposite to the wiring layer 38. As is clear from the back side light reception type pixel structure, only the light-shielding layer 33 is present as a metallic layer in the range from the micro-lens 36 to the photo-diode 37, and the height of the light-shielding layer 33 from the photo-diode 37 is as small as the thickness of the SiO2 film 32 (for example, about 0.5 µm), so that limitations on focusing due to the scattering by metallic layers can be obviated.

Figure 4:
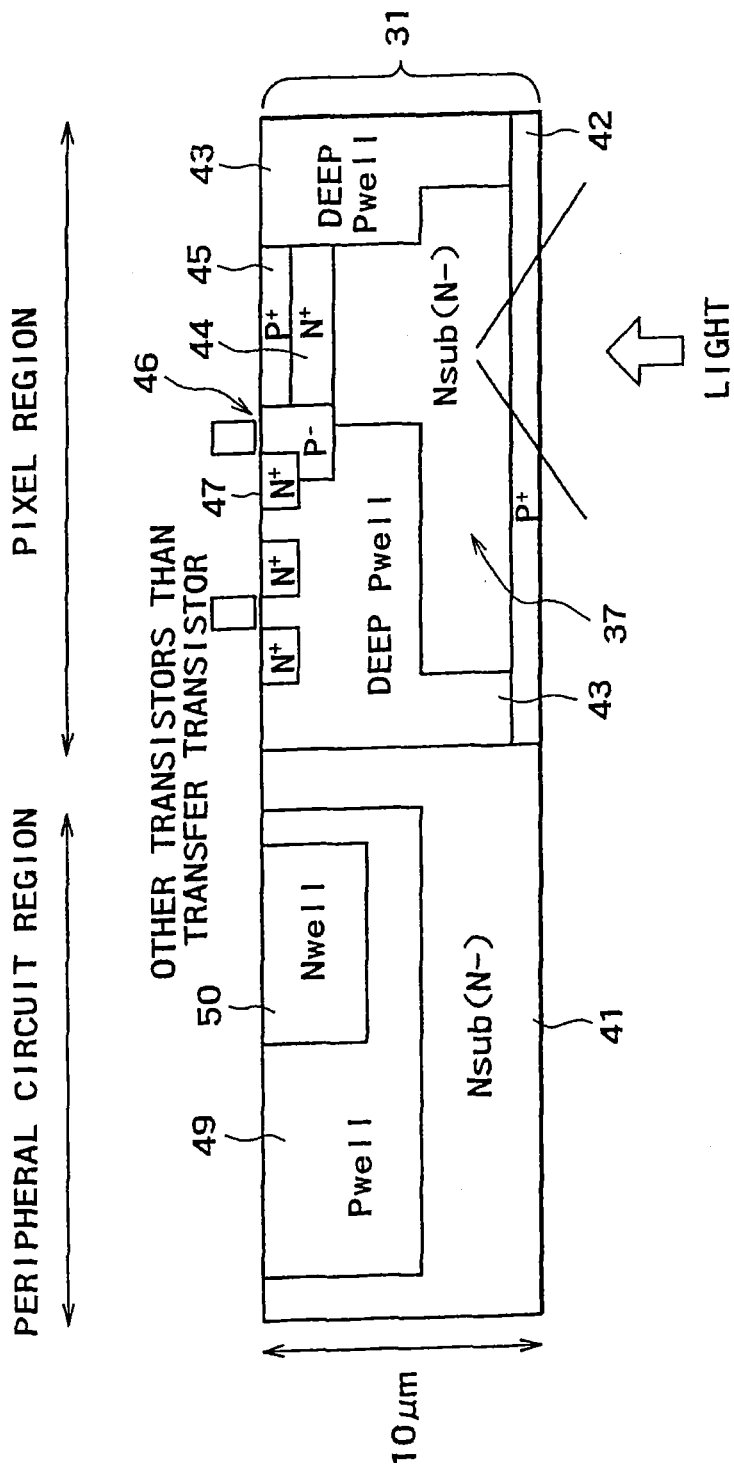
FIG. 4 is a sectional structural view showing an example of a well structure of a silicon layer.

FIG. 4 is a sectional structural view showing an example of a well structure of the silicon layer 31, in which the same portions as those in FIG. 3 are denoted by the same symbols.

In this example, an N⁻ type substrate 41 is used. The thickness of the silicon layer 31 is desirably 5 to 15 µm for visible rays, as described above; in this example, it is 10 µm. By this, good photo-electric conversion of visible rays can be achieved. On one side of the silicon layer 31, a shallow $P_+$ layer 42 is provided over the entire area of the pixel portion. A pixel isolation region is formed of a deep P well 43, which is connected to the $P_+$ layer 42 on the one side.

The photo-diode 37 is formed by utilizing the N⁻ type substrate 41, namely, by not providing the P well there. This N⁻ type region (substrate) 41 is the photo-electric conversion region, and it is completely depleted because it is small in area and concentration. An $N_+$ region 44 for accumulating the signal charge (in this example, electrons) is provided on the N⁻ type region (substrate) 41, and, further, a $P_+$ layer 45 for forming an embedded photo-diode is provided thereon.

As is clear from FIG. 4, the photo-diode 37 is so formed as to be greater in surface area on the light-receiving surface side than on the side of the wiring layer 38. With this structure, the incident light can be taken in efficiently. The signal charge obtained through photo-electric conversion by the photo-diode 37 and accumulated in the $N_+$ region 44 is transferred to the FD (floating diffusion) 47 composed of $N_+$ type region by a transfer transistor 46 (the transfer transistor 22 in FIG. 2). The photo-diode 37 side and the FD 47 are electrically isolated from each other by a P-layer 48.

The other transistors (the amplifying transistor 23, the address transistor 24 and the reset transistor 25 in FIG. 2) than the transfer transistor 46 in the pixel are formed in the deep P well 43, in the same manner as usual. On the other hand, as for the peripheral circuit region, a P well 49 is formed with such a depth as not to reach the $P_+$ layer 42 on the back side, an N well 50 is further formed inside the P well 49, and a CMOS circuit is formed in the region of these wells 49, 50.

Figure 5:
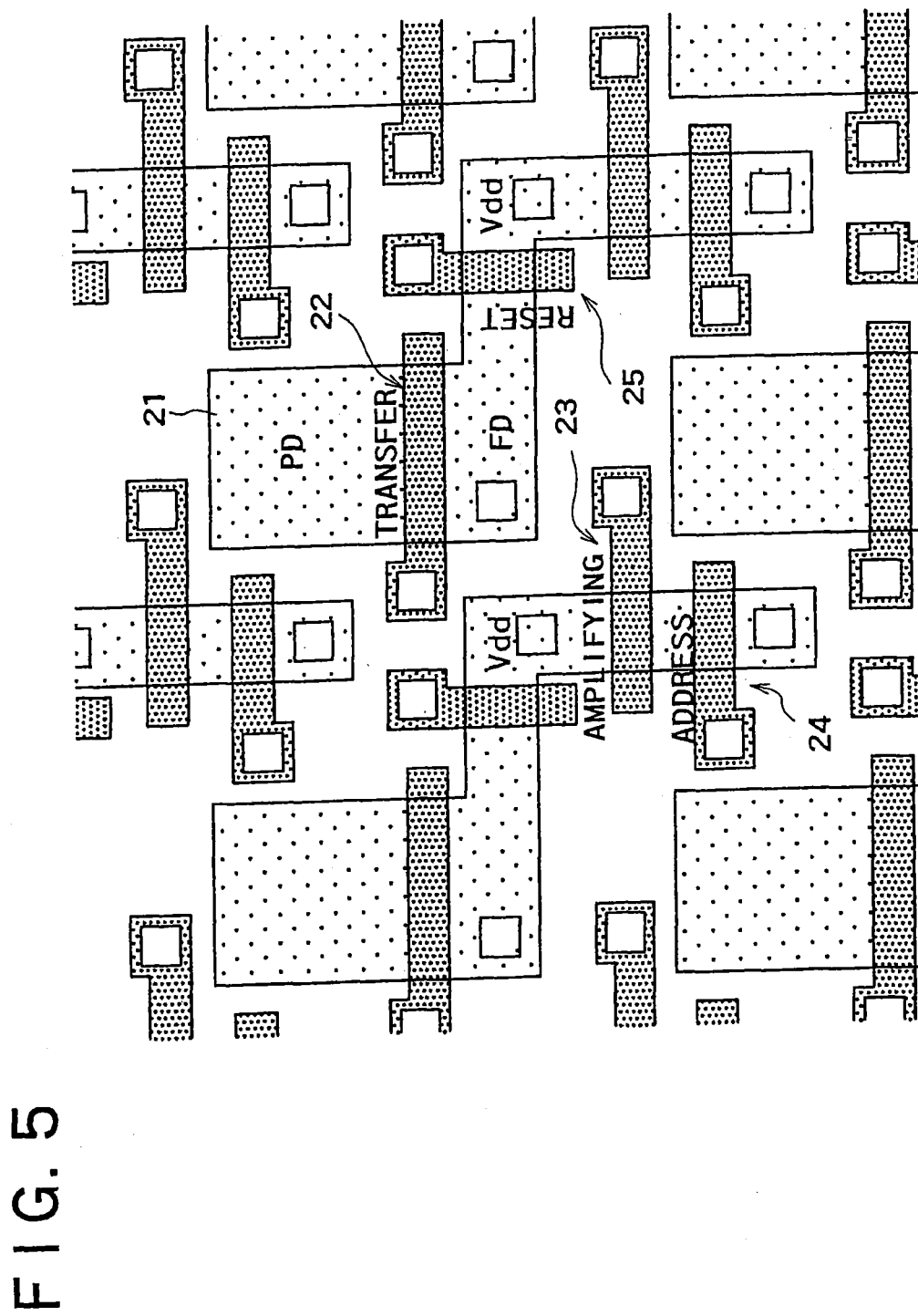
FIG. 5 is a plan pattern diagram showing active regions (regions of gate oxide films), gate (polysilicon) electrodes and contact portions of both of them.
Figure 6:
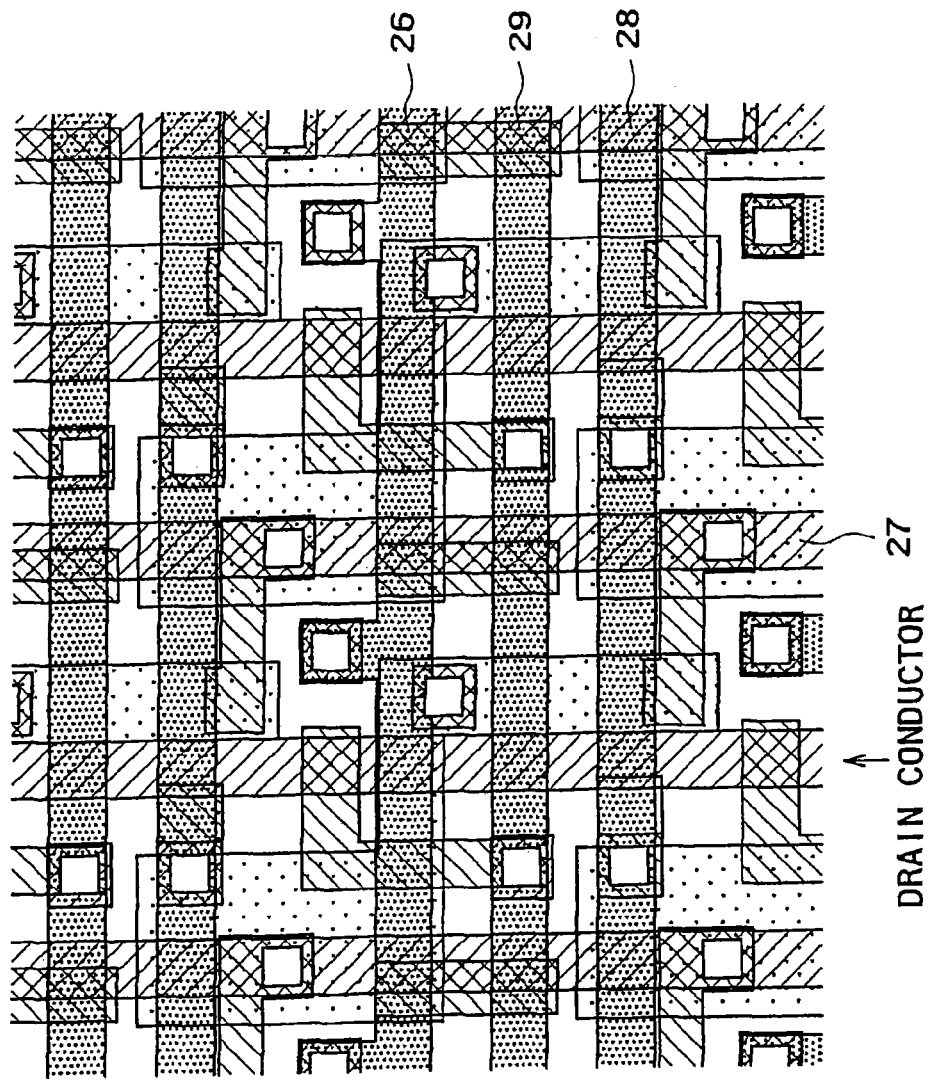
FIG. 6 is a plan pattern diagram showing metallic wirings above the gate electrodes and contact portions therebetween, together with the active regions.

Next, an example of layout of the pixels will be described referring to FIGS. 5 and 6. In FIGS. 5 and 6, the same portions as those in FIG. 2 are denoted by the same symbols. FIG. 5 is a plan pattern diagram showing active regions (regions of gate oxide film), gate (polysilicon) electrodes, and contact portions of both of them. As is clear from the figure, one photo-diode (PD) 21 and four transistors 22 to 25 exist per unit pixel.

FIG. 6 is a plan pattern diagram showing metallic wirings above the gate electrodes and contact portions therebetween, together with the active regions. Here, the metallic wirings (for example, aluminum wirings) have a three-layer structure, in which the first layer is used as in-pixel wirings. the second layer is used as wirings in the vertical direction, namely, as vertical signal conductors 27 and drain conductors, and the third layer is used as wirings in the horizontal direction, namely, transfer wirings 26, address wirings 28, and reset wirings 29.

As is clear from the wiring pattern of FIG. 6, the vertical signal conductor 27, the transfer wiring 26, the address wiring 28 and the reset wiring 29 are arranged on the photo-diode region. In the conventional pixel structure, namely, in the face side light reception type pixel structure in which light is taken in from the wiring layer side, these wirings have been laid out by avoiding the photo-diode region. On the other hand, in the pixel structure according to this embodiment, as is clear from FIG. 3, the back side light reception type pixel structure is adopted in which the light is taken in from the opposite side (back side) of the wiring layer, so that the wirings can be laid out on the photo-diode region.

As has been described above, in the X-Y address type solid state image pickup device represented by the CMOS image sensor, the back side light reception type pixel structure is adopted in which visible light is received from the back side of the photo-diodes 37. Therefore, the need for wiring by taking the light-receiving surface into account as in the conventional face side light reception type pixel structure is eliminated, so that the degree of freedom in wiring for pixels is enhanced, miniaturization of the pixels can be contrived, and the system can be produced by an advanced CMOS process with an increased number of wiring layers.

In addition, since the photo-diode 37 is formed with such a depth as to reach the $P_+$ layer 45 on the back side, the sensitivity to blue light for which absorbance is high is enhanced. Besides, since photo-electric conversion at a deeper portion than the photo-diode 37 does not occur, it is possible to obviate color mixture and erroneous detection of black level which might otherwise be generated. Further, as is clear particularly from FIG. 3, the wiring layer 38 is not present on the light-receiving surface side, so that it is possible to provide the light-shielding film 33, the color filter 35 and the micro-lens 36 at lower positions relative to the light-receiving surface. Accordingly, the problems of lowering of sensitivity, color mixture, and reduction of light amount at peripheral areas as encountered in the related art can be solved.

Figure 7:
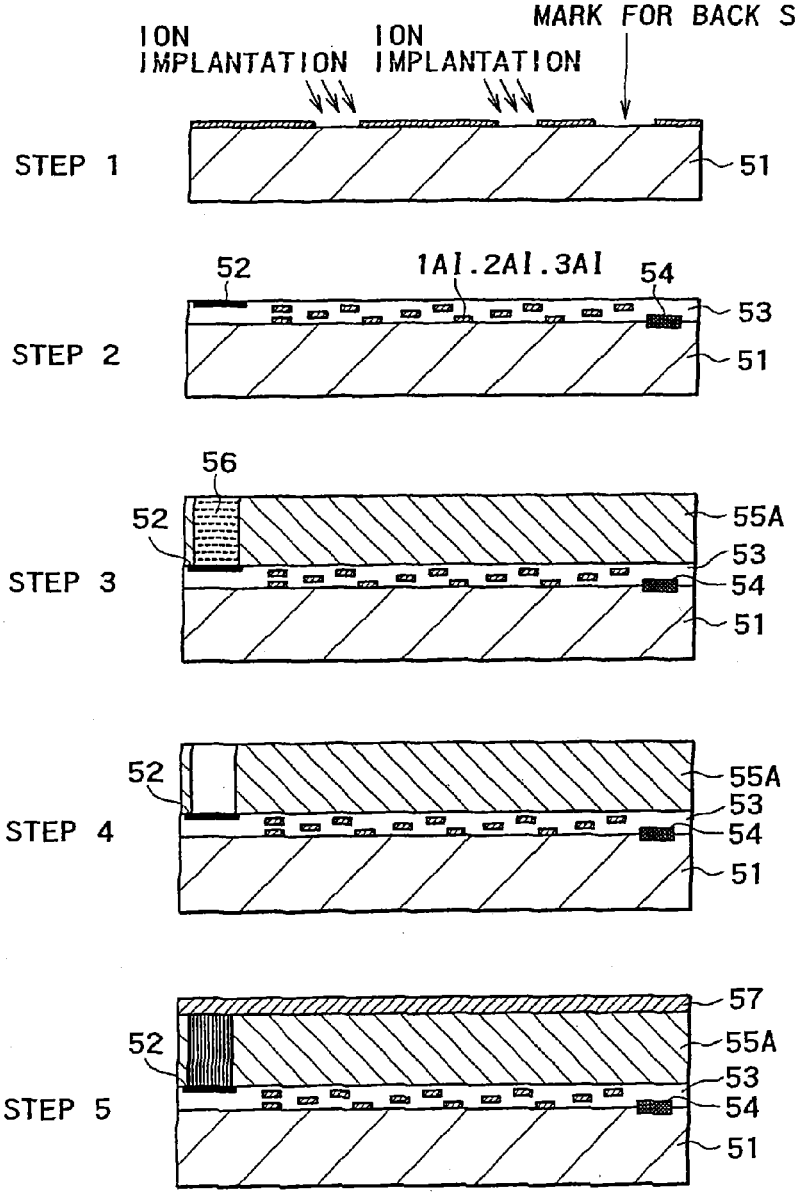
FIG. 7 shows step diagrams (No. 1) for illustrating the process of fabricating a CMOS image sensor having the back side light reception type pixel structure.
Figure 8:
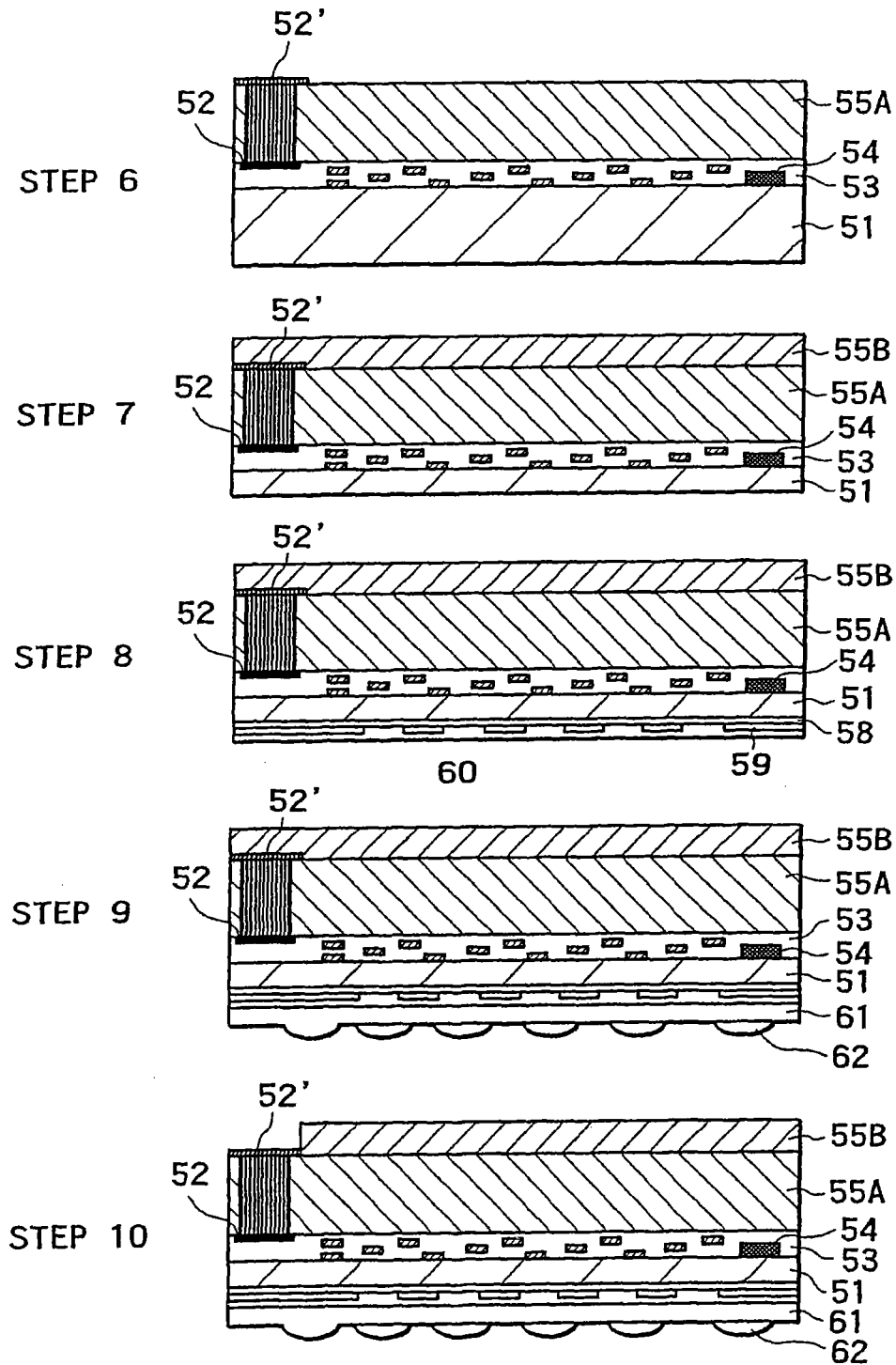
FIG. 8 shows step diagrams (No. 2) for illustrating the process of fabricating the CMOS image sensor having the back side light reception type pixel structure.
Figure 9:
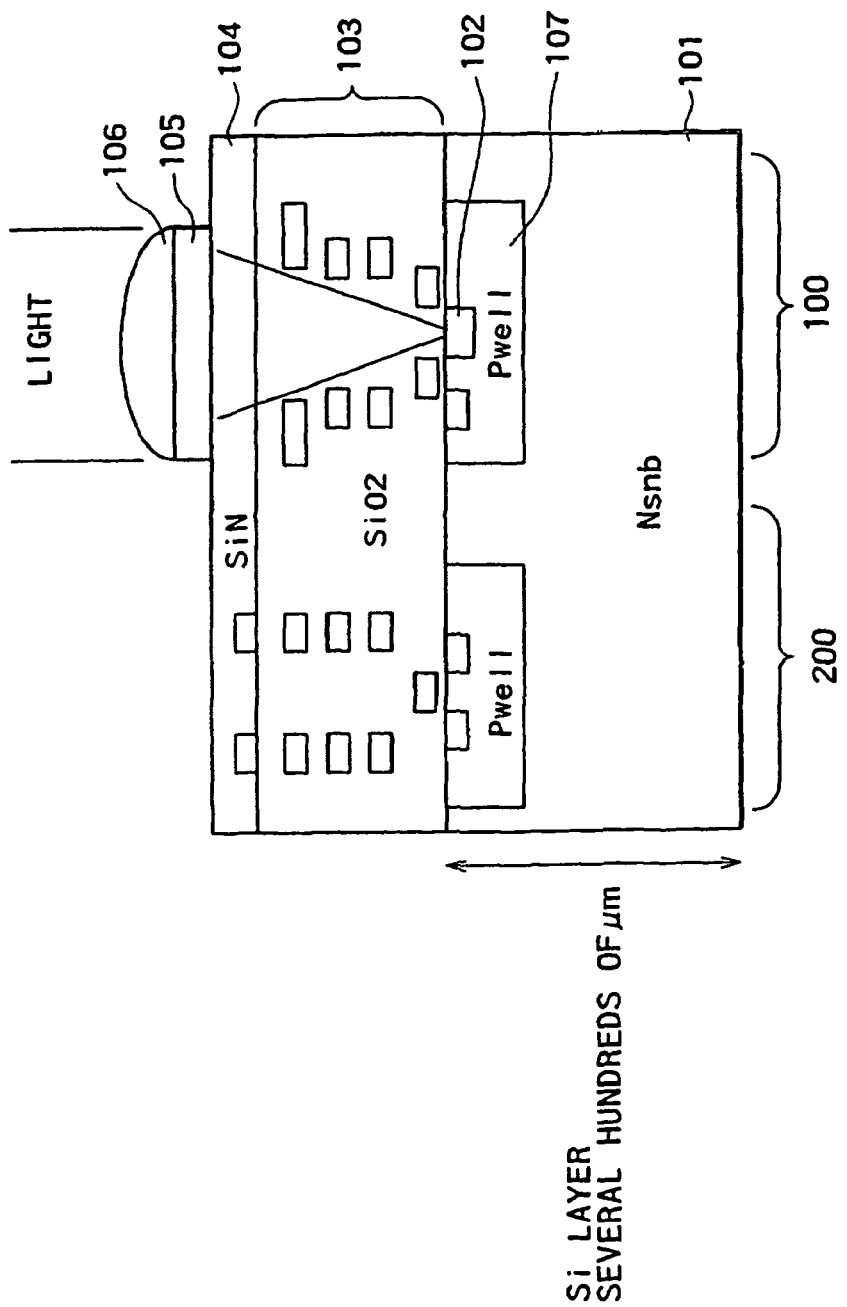
FIG. 9 is a sectional structural view showing a conventional structure of CMOS image sensor.

Next, the process for fabricating the CMOS image sensor having the back side light reception type pixel structure constituted as described above will be described referring to the step diagrams shown in FIGS. 7 and 8.

First, a device isolator and a gate electrode (polysilicon electrode) are formed at a surface of an $N^-$ type substrate 51, then the deep P well 43 at the pixel portion, the shallow $P_+$ layer 42 at the photo-diode portion, the shallow P well 49 at the peripheral circuit portion and the N well 50 as above-mentioned are formed by ion implantation, and, further, transistors and pixel active regions and the like are formed by the same step as that for the conventional CMOS image sensor (Step 1). At this time, the substrate 51 is trenched by about several tens of μm for forming a register mark for the back side.

Next, the first to third layers of metallic wiring (1Al, 2Al, 3Al), a pad (PAD) 52 and an interlayer insulating film 53 are provided on the surface of the substrate 51 (Step 2). At this time, for example. tungsten (W) or aluminum (Al) is embedded in the register mark portion for back side which has been trenched in Step 1, thereby forming the register mark 54. Subsequently, a first substrate support member (for example, glass, silicon, an organic film or the like) 55A is made to flow on the upper surface of the wiring layer in a thickness of several hundreds of μm (Step 3). At this time, the upper side of the pad 52 is preliminarily masked with a resist 56.

Next, the resist 56 on the upper side of the pad 52 is removed, and a surface treatment is conducted to cause a metal to flow into the bump thus formed (Step 4). Subsequently, an electrical conductor 57 is caused to flow into the bump opening on the upper side of the pad 52 and on the surface of the first substrate support member 55A (Step 5). Thereafter, the electrical conductor 57 on the surface of the substrate support member 55 is removed, leaving only the portion on the upper side of the pad 52 (Step 6). The left portion becomes a pad 52'.

Next, a second substrate support member 55B is caused to flow for protecting the pad 52' during processing of the back side and for planarization of the surface, then polishing is conducted. the wafer is turned upside down, and polishing is conducted by CMP until the thickness of the substrate 51 becomes about 10 μm (Step 7). Subsequently, an SiO2 film is formed in a thickness of about 10 nm by CVD (Chemical vapor Deposition), then a resist is applied according to the register mark 54, and the entire surface of the pixel portion is dosed with boron so that the SiO2 interface is filled with positive holes (Step 8). In Step 8. further, an SiO2 film 58 is formed by CVD on the back side in a thickness of about 500 nm, then a light-shielding film 59 is formed by use of Al or W, and thereafter a plasma SiN film is formed as a passivation film 60 by CVD.

Next, a color filter 61 and a micro-lens 62 are formed by the same method as in the case of the conventional CMOS image sensor (Step 9). At this time, stepper registration is conducted by use of the register mark 54 or by use of the light-shielding film 59. Subsequently, the second substrate support member 55B on the pad 52' is removed by etching, to expose the pad 52' (Step 10). In this case, if required, the second substrate support member 55B is polished to a desired thickness for registration of the micro-lens 62 and for planarization of the chip.

According to the method described above, the back side light reception type pixel structure can be produced easily. In addition, a structure in which the pad 52' is exposed on the side opposite to the light-receiving surface. Therefore, the present CMOS image sensor can be mounted directly on the substrate in the condition where the light-receiving surface is directed upwards.

While a preferred embodiment of the invention has been described using specific terms, such description is for illustrative purpose only, and it is to be understood that changes and variations may be made without departing from the spirit or scope of the following claims.

We claim:
1. An imaging device comprising:
a well region of a first conductivity type within a semiconductor layer, said well region being between a first surface of the semiconductor layer and a light-receiving surface of the semiconductor layer;
a first layer of the first conductivity type within said semiconductor layer, said first surface being between an interlayer insulating film and said first layer;
a photo-electric conversion region of a second conductivity type within said semiconductor layer, said photo-electric conversion region being between said first layer and said light-receiving surface;

an isolation region of the first conductivity type within said semiconductor layer, said isolation region being between said first surface and said light-receiving surface;

a back side layer of the first conductivity type at said light-receiving surface, said back side layer extending into said semiconductor layer, wherein said back side layer is in physical contact with said isolation region, said well region being physical contact with said first layer and said photo-electric conversion region.

2. The device of claim 1, wherein said first surface is opposite to said light-receiving surface.

3. The device of claim 1, wherein said first layer is at said first surface, said first layer extending into said semiconductor layer.

4. The device of claim 1, wherein said well region is at said first surface, said well region extending into said semiconductor layer.

5. The device of claim 1, further comprising:

electrodes and wirings within said interlayer insulating film.

6. The device of claim 1, wherein a surface area of the photo-electric conversion region is largest at said back side layer.

7. The device of claim 1, wherein said back side layer is in physical contact with said well region and said photo-electric conversion region.

8. The device of claim 1, wherein said photo-electric conversion region is between said back side layer and said first layer.

9. The device of claim 1, wherein said photo-electric conversion region is in physical contact with said back side layer and said first layer.

10. The device of claim 1, further comprising:

an insulator between said back side layer and a light-shielding film, an opening portion being a hole through said light-shielding film.

11. The device of claim 10, further comprising:

a color filter between said opening portion and a microlens.

12. The device of claim 10, wherein said light-shielding film is a metallic layer.

13. The device of claim 10, wherein said photo-electric conversion region is configured to convert a spectrum of light into a signal charge, said light being transmissible through said opening portion.

14. The device of claim 13, further comprising:

a gate electrode configured to transfer said signal charge from said photo-electric conversion region.

15. The device of claim 1, wherein said first conductivity type is P-type.

16. The device of claim 1, wherein said second conductivity type is N-type.

17. The device of claim 1, wherein said first conductivity type is opposite to said second conductivity type.

* * * * *